United States Patent
Duprey et al.

(10) Patent No.: US 9,330,105 B1
(45) Date of Patent: May 3, 2016

(54) SYSTEMS, METHODS, AND COMPUTER READABLE MEDIA FOR LAZY COMPRESSION OF DATA INCOMING TO A DATA STORAGE ENTITY

(75) Inventors: Dennis Duprey, Raleigh, NC (US); Mayank Ajmera, Morrisville, NC (US); Derek Scott, Morrisville, NC (US)

(73) Assignee: EMC Corporation, Hopkinton, MA (US)

( * ) Notice: Subject to any disclaimer, the term of this patent is extended or adjusted under 35 U.S.C. 154(b) by 393 days.

(21) Appl. No.: 12/822,173

(22) Filed: Jun. 23, 2010

Related U.S. Application Data (60) Provisional application No. 61/332,622, filed on May 7, 2010.

(51) Int. Cl.
G06F 17/30 (2006.01)
G06F 12/02 (2006.01)

(52) U.S. Cl.
CPC ...... *G06F 17/30153* (2013.01); *G06F 12/0246* (2013.01)

(58) Field of Classification Search
None
See application file for complete search history.

(56) References Cited

U.S. PATENT DOCUMENTS

| | | | | |
|---|---|---|---|---|
| 5,140,592 | A * | 8/1992 | Idleman et al. | 714/5.11 |
| 5,459,850 | A * | 10/1995 | Clay et al. | 711/171 |
| 6,192,432 | B1 * | 2/2001 | Slivka et al. | 710/68 |
| 6,310,563 | B1 * | 10/2001 | Har et al. | 341/50 |
| 6,349,372 | B1 * | 2/2002 | Benveniste et al. | 711/159 |
| 6,360,300 | B1 | 3/2002 | Corcoran et al. | |
| 6,442,659 | B1 * | 8/2002 | Blumenau | 711/162 |
| 7,702,873 | B2 | 4/2010 | Griess et al. | |
| 7,814,128 | B2 | 10/2010 | Silvers et al. | |
| 8,140,821 | B1 | 3/2012 | Raizen et al. | |
| 8,359,444 | B2 * | 1/2013 | Arakawa | 711/165 |
| 8,392,382 | B2 * | 3/2013 | Marwah et al. | 707/693 |
| 8,886,909 | B1 | 11/2014 | De Forest et al. | |
| 8,924,681 | B1 | 12/2014 | Throop et al. | |
| 2004/0054850 | A1 | 3/2004 | Fisk | |
| 2006/0010290 | A1 | 1/2006 | Sasamoto | |
| 2007/0005625 | A1 * | 1/2007 | Lekatsas et al. | 707/101 |
| 2007/0150690 | A1 | 6/2007 | Chen et al. | |
| 2008/0066069 | A1 * | 3/2008 | Verbowski et al. | 718/102 |
| 2009/0106281 | A1 * | 4/2009 | Marwah et al. | 707/101 |

(Continued)

OTHER PUBLICATIONS

Final Office Action for U.S. Appl. No. 12/826,385 (Sep. 10, 2013).

(Continued)

*Primary Examiner* — Jay Morrison
(74) *Attorney, Agent, or Firm* — Jenkins, Wilson, Taylor & Hunt, P.A.

(57) ABSTRACT

Systems, methods, and computer readable media for lazy compression of data incoming to a data storage entity are disclosed. According to one aspect, a method for lazy compression of data incoming to a data storage entity includes defining at least a portion of the data storage area within the data storage entity as a compressed logical unit for storing at least some data in compressed form; receiving a command to write data to the compressed logical unit, and, in response to receiving the command to write data to the compressed logical unit, writing the data in uncompressed form; and monitoring for a trigger condition, wherein, upon detection of a trigger condition, at least a portion of the uncompressed data within the compressed logical unit is compressed.

22 Claims, 8 Drawing Sheets

(56) References Cited

U.S. PATENT DOCUMENTS

2009/0292870 A1  11/2009  Sambe et al.
2009/0307424 A1  12/2009  Galloway et al.

OTHER PUBLICATIONS

Non-Final Office Action for U.S. Appl. No. 12/826,385 (Mar. 5, 2013).
Interview Summary for U.S. Appl. No. 12/826,385 (Mar. 1, 2013).
Commonly-assigned, co-pending U.S. Appl. No. 12/826,385 for "Systems, Methods, and Computer Readable Media for Compressing Data at a Virtually Provisioned Storage Entity" (Unpublished, filed Jun. 29, 2010).
Non-Final Office Action for U.S. Appl. No. 12/751,685 (Apr. 10, 2014).
Non-Final Office Action for U.S. Appl. No. 12/826,385 (Feb. 20, 2014).
Final Office Action for U.S. Appl. No. 12/100,514 (Feb. 6, 2014).
Non-Final Office Action for U.S. Appl. No. 12/826,385 (Jan. 2, 2015).
Final Office Action for U.S. Appl. No. 12/826,385 (Aug. 8, 2014).
Applicant-Initiated Interview Summary for U.S. Appl. No. 12/826,385 (Jun. 26, 2014).
Lacroix, "EMC Introduces New EMC CLARiiON CX4 Series with Next Generation Architecture," EMC Press Release, http://www.emc.com/about/news/press/2008/20080805-01.htm, pp. 1-5 (Aug. 5, 2008).
Applicant-Initiated Interview Summary for U.S. Appl. No. 12/826,385 (Apr. 6, 2015).
McGaughey, Katryn, "New Levels of EMC Midrange Storage Efficiency and Simplicity Accelerate Journey to The Private Cloud," EMC Press Release, pp. 1-4, http://www.emc.com/about/news/press/2010/20100511-02.htm, (May 11, 2010).
Sakac, Chad, "EMC Unified Storage—Next Generation Efficiency Details," Virtual Geek blog, pp. 1-15, http://virtualgeek.typepad.com/virtual_geek/2010/05/emc-unified-storage-next-generation-efficiency-details.html, (May 11, 2010).
Non-Final Office Action for U.S. Appl. No. 12/826,385 (Jul. 31, 2015).

* cited by examiner

SYSTEMS, METHODS, AND COMPUTER READABLE MEDIA FOR LAZY COMPRESSION OF DATA INCOMING TO A DATA STORAGE ENTITY

PRIORITY CLAIM

This application claims the benefit of U.S. Provisional Patent Application Ser. No. 61/332,622, filed May 7, 2010; the disclosure of which is incorporated herein by reference in its entirety.

TECHNICAL FIELD

The subject matter described herein relates to methods and systems for managing data in data storage devices. More particularly, the subject matter described herein relates to systems, methods, and computer readable media for lazy compression of data incoming to a data storage entity.

BACKGROUND

To reduce the storage space taken by data that is stored on a data storage device, the data may be compressed at the time of writing, e.g., compressed data, rather than uncompressed data, is written to the data storage device.

Some algorithms perform compression by replacing often-repeated sequences of text or data with substitute placeholder that is smaller in size than the sequence that it replaces. The larger the sequences that are replaced, the more efficient the algorithm becomes, allowing the compressed file to be smaller and smaller relative to the size of the uncompressed file. Such compression algorithms will first search the entirety of the data to be compressed, called the compression domain, to find the largest sequences that are repeated within the compression domain. The larger the compression domain, the more opportunities there are for the compression algorithm to find larger repeating sequences. For this reason, compression algorithms tend to be more efficient as the compression domain gets larger.

However, in systems where the content of the compression domain changes, the compressed data must be decompressed, modified, and recompressed. For this reason, system performance tends to be less efficient as the compression domain gets larger, because a change to any portion of a large compression domain requires that the entire compression domain be decompressed, modified, and recompressed. If, instead, the dataset is divided into smaller compression domains, a change to one portion of the dataset requires decompression and recompression of a smaller portion of the dataset.

Choosing the size of the compression domain is therefore a balance between compression efficiency and system performance. Choosing the boundaries of the compression domains can also have a significant effect on compression efficiency and system performance. A compression domain may be very large if the data within its boundaries—i.e., the contents of that compression domain—do not change very often.

One approach to selecting the boundary of a compression domain is to attempt to encompass data that will be likely to change together or not change at all. That is, if one portion of the data within the compression domain changes, other portions of the data within the compression domain are also likely to change, resulting in a decompress-modify-modify-modify-recompress strategy. This increases efficiency because the decompress and recompress operations are typically more resource-intensive than the modify operations. In other words, if the system has to go to the trouble of decompressing and recompressing, the overhead caused by multiple modifications is relatively small in comparison.

One conventional example of this approach is what is herein referred to as "file-based" compression, in which the file construct is the boundary of the compression domain: one file is one compression domain, another file is another compression domain, and so on. When one portion of a file changes, it is likely that other portions of the same file also change, but does not increase the likelihood that another file will also change.

There are disadvantages to file-based compression, however. Storage devices may not operate at the file level, and thus may not even be aware of the file construct. For example, a hard disk drive may respond to requests for logical blocks of available storage space, without knowing to which file, if any, those logical blocks belong. Thus, file-based compression cannot be implemented by a low level entity, such as the storage device, but must be controlled by a higher-level entity, i.e., one that is aware of the file structure and the mapping of file to logical or physical addresses within the storage device. In file-based compression, the file itself is compressed, but the meta-data that describes the file or its location, such as the directory entry for the file, is not compressed. For this reason, the file contents must be compressed before being sent to the data storage device: the data storage system receives commands to write the already compressed data to the data storage device. Furthermore, the file system must maintain information with each file to indicate whether the file data that is stored on the data storage is device is compressed or uncompressed data.

Another conventional approach is for the compression domain to be equal to the unit of reservation or unit of allocation used by the data storage system. For example, multiple data storage devices may collectively provide a pool of data storage blocks that may be allocated to logical units or reserved by processes. In this scenario, each logical unit or portion thereof may be a separate compression domain. Under this approach, the compression domain is not based on a storage block's membership in a file, but on the storage block's membership with a unit of reservation or a unit of allocation. This approach has the advantage that compression can be performed at a low level, e.g., by the allocation or reservation entity or even by the storage device itself, without having to know the higher-level file or directory structures. Furthermore, the file system operates as if every file is uncompressed, and will send and receive uncompressed file data, which is silently compressed before write to the data storage device and uncompressed upon read from the data storage device.

However, there are disadvantages to this approach, as well. In systems where the logical unit has been selected as the compression domain, any write into the logical unit can potentially require (and probably will require) the decompress-modify-recompress operation to be performed. In addition, regardless of the size of the compression domain, the decompress and recompress steps are resource-intensive (and therefore also time-intensive). Furthermore, the compression operation is multiple times more resource intensive than the decompression operation. For systems that perform multiple decompress-modify-recompress operations, this can cause a severe bottleneck in performance when reading from and writing to a compressed logical unit.

Accordingly, in light of these disadvantages associated with conventional methods for compression of data stored within a data storage device, there exists a need for systems, methods, and computer-readable media for lazy compression of data incoming to a data storage entity.

SUMMARY

According to one aspect, the subject matter described herein includes a method for lazy compression of data incoming to a data storage entity. The method includes defining at least a portion of the data storage area within the data storage entity as a compressed logical unit for storing at least some data in compressed form. A command to write data to the compressed logical unit is received, and, in response to receiving the command to write data to the compressed logical unit, the data is written to the compressed logical unit in uncompressed form. The method also includes monitoring for a trigger condition, and, upon detection of a trigger condition, compressing at least a portion of the uncompressed data within the compressed logical unit.

According to another aspect, the subject matter described herein includes a method for lazy decompression of a compressed portion of a data storage entity. At a data storage entity having at least a portion of the data storage area within the data storage entity designated as a compressed logical unit for containing data in compressed form, the compressed logical unit is designated as being subject to lazy decompression. A command to read data from or write data to a compressed target portion of the compressed logical unit is received. In response to receiving the command, the compressed target portion is decompressed, and the read or write command is performed on the uncompressed target portion. Compressed portions of the compressed logical unit that are not the target of any read or write command are not decompressed.

According to another aspect, the subject matter described herein includes a system for lazy compression of data incoming to a data storage entity. The system includes multiple data storage devices having data storage space for storing data, the collective data storage space being divided into a plurality of slices for allocation to at least one compressed logical unit for storing at least some data in compressed form. The system includes a first module for receiving a command to write data to the compressed logical unit, and, in response to receiving the command to write data to the compressed logical unit, writing the data to the compressed logical unit in uncompressed form. The system includes a second module for monitoring for a trigger condition, and, upon detection of a trigger condition, compressing at least a portion of the uncompressed data within the compressed logical unit.

The subject matter described herein for lazy compression of data incoming to a data storage entity may be implemented in hardware, software, firmware, or any combination thereof. As such, the terms "function" or "module" as used herein refer to hardware, software, and/or firmware for implementing the feature being described. In one exemplary implementation, the subject matter described herein may be implemented using a computer readable medium having stored thereon computer executable instructions that when executed by the processor of a computer control the computer to perform steps. Exemplary computer readable media suitable for implementing the subject matter described herein include non-transitory computer-readable media, such as disk memory devices, chip memory devices, programmable logic devices, and application specific integrated circuits. In addition, a computer readable medium that implements the subject matter described herein may be located on a single device or computing platform or may be distributed across multiple devices or computing platforms.

BRIEF DESCRIPTION OF THE DRAWINGS

Preferred embodiments of the subject matter described herein will now be explained with reference to the accompanying drawings, wherein like reference numerals represent like parts, of which.

DETAILED DESCRIPTION

In accordance with the subject matter disclosed herein, systems, methods, and computer readable media are provided for lazy compression of data incoming to a data storage entity. When writing data to a compressed logical unit, or modifying data within the compressed logical unit, data is not written to the logical unit in compressed form, but is instead written to the logical unit in uncompressed form, and compressed when and if necessary. Rather than a file-based compression domain, block-based compression domains are used. Rather than defining the compression domain to be the size of the entire logical unit, a single logical unit may include multiple compression domains.

Reference will now be made in detail to exemplary embodiments of the present invention, examples of which are illustrated in the accompanying drawings. Wherever possible, the same reference numbers will be used throughout the drawings to refer to the same or like parts.

Figure 1A:
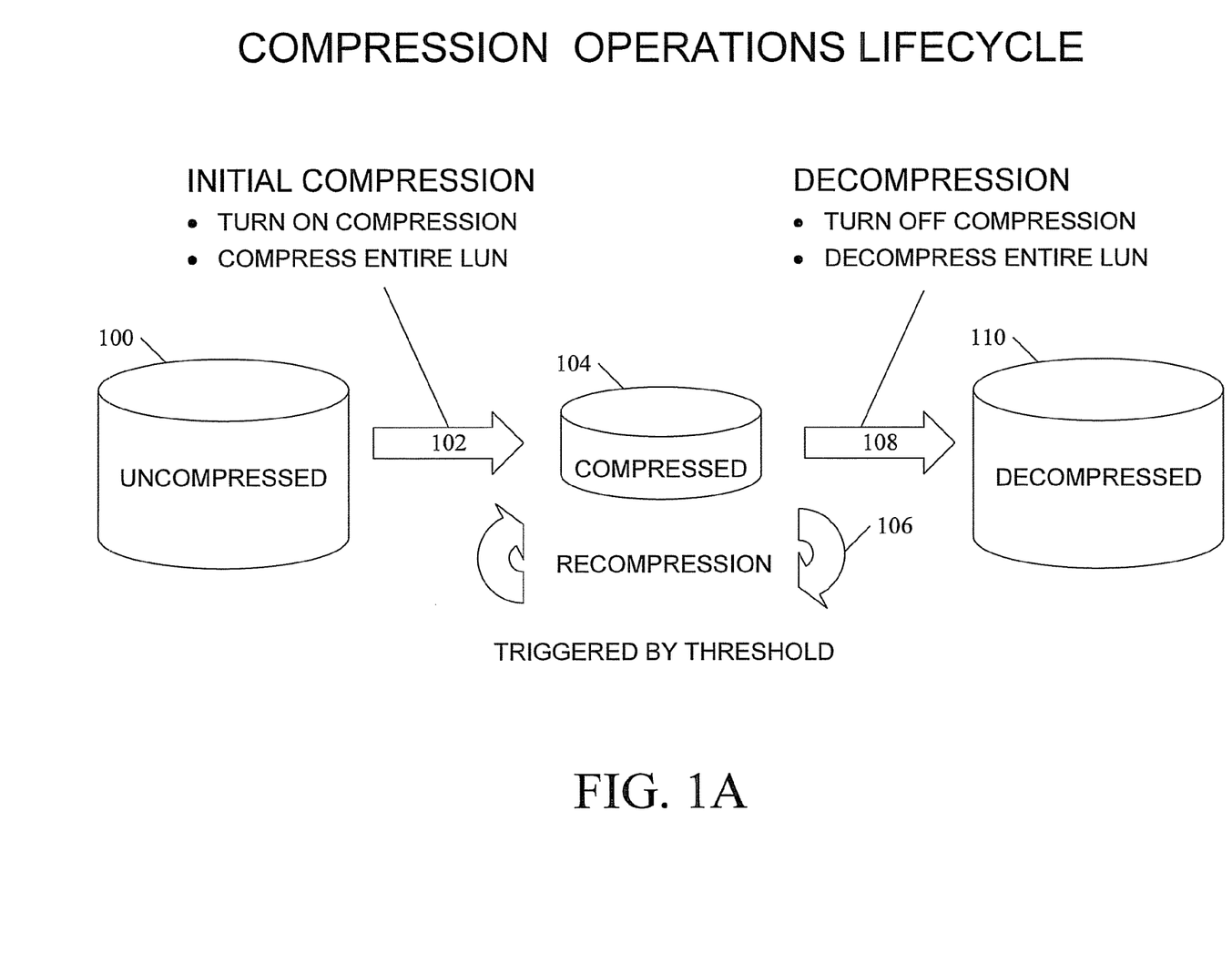
FIG. 1A is a block diagram illustrating a compression operations lifecycle according to an embodiment of the subject matter described herein.

FIG. 1A is a block diagram illustrating a compression operations lifecycle according to an embodiment of the subject matter described herein. In FIG. 1A, a volume of data storage, such as a logical unit, may begin in an uncompressed state 100, meaning that data contained within the volume, if any, is not compressed.

Upon initiation of an initial compression 102, compression for the volume is turned on, meaning that all incoming data is at least potentially subject to compression. If the volume already contains uncompressed data, the data on that volume is compressed. The result of initial compression 102 is the creation of a volume in a compressed state 104. This volume will be subject to recompression 106 in response to the detection of certain triggers, such as the detection of a threshold condition. The volume in compressed state 104 may be recompressed multiple times.

Upon initiation of a decompression 108, such as if the volume type is changed to uncompressed type or if the volume is otherwise converted to an uncompressed volume, compression is turned off for incoming data, and any data currently existing within the volume is decompressed. As a result of decompression 108, the volume is decompressed 110, e.g., the volume returns to the uncompressed state. In data storage systems that implement lazy compression according to an embodiment of the subject matter described herein, recompression step 106 may be deferred, perhaps indefinitely. An example of this behavior is illustrated in FIG. 1B.

Figure 1B:
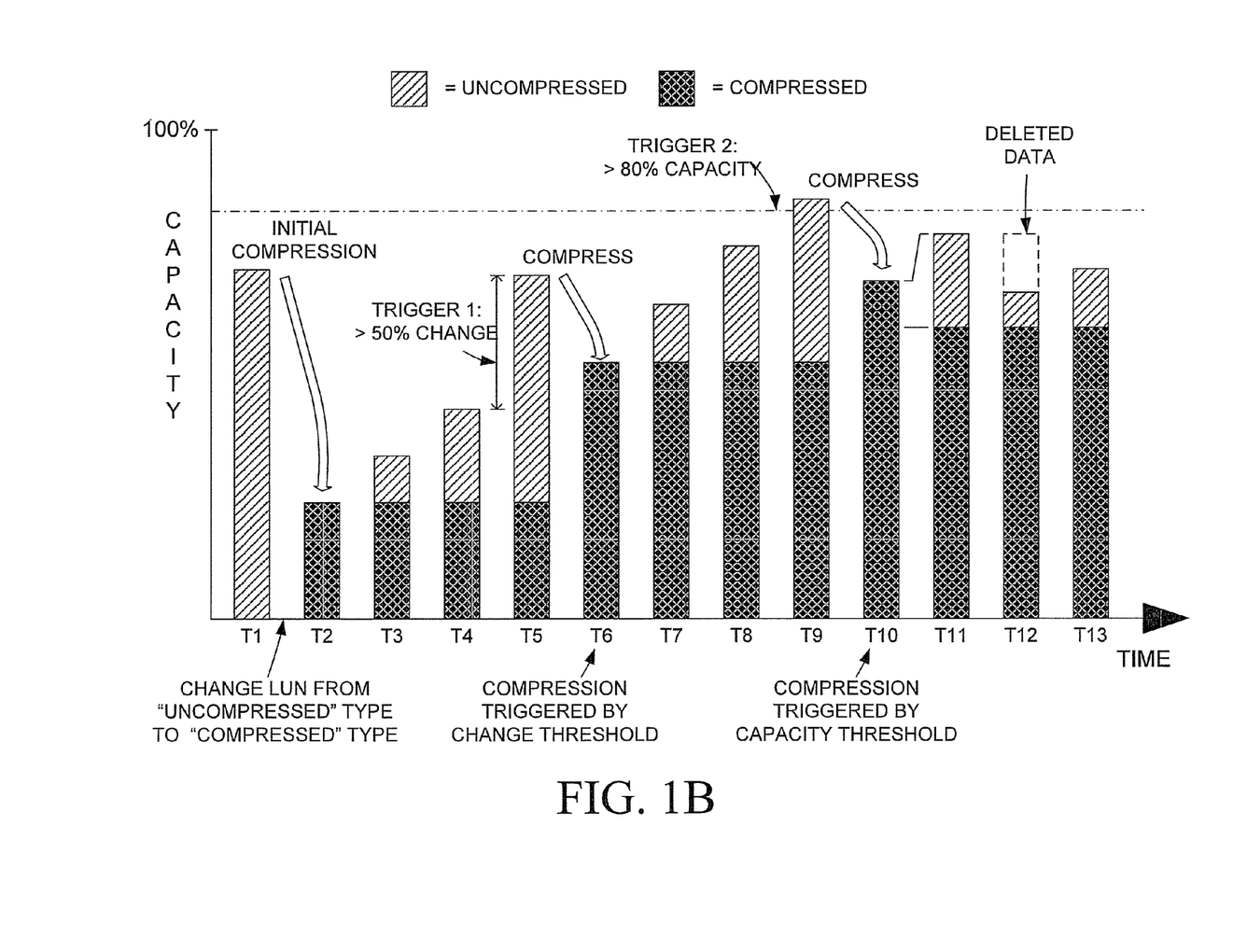
FIG. 1B is a bar graph illustrating the principle of operation of lazy compression according to an embodiment of the subject matter described herein.

FIG. 1B is a bar graph illustrating the principle of operation of lazy compression according to an embodiment of the subject matter described herein. In FIG. 1B, the Y axis indicates the capacity of an example logical unit and how the utilization of that capacity changes over time, which is shown on the X axis. The state of the logical unit is shown at various times labeled T1 through T13. At time T1, the logical unit contains only uncompressed data, and is at approximately 75% utilization. Between time T1 and T2, the logical unit is changed from an "uncompressed" type, i.e., one that stores only uncompressed data, to a "compressed" type, i.e., one that stores compressed data but also may store uncompressed data according to the lazy compression approach described herein. As a result of the change from uncompressed type to compressed type, at time T2, all of the data in the logical unit has been compressed, to approximately 25% utilization.

From this point in time, additional data may be written to the logical unit, either as a result of new data being stored on the logical unit or as a result of existing data being modified. Thus, at time T3, T4, and T5, additional data is written to the logical unit, but because the logical unit employs lazy compression, the data is written in uncompressed form and the logical unit is not recompressed until a trigger condition occurs. Time T5 illustrates one type of trigger condition, a change in the utilization. In the example shown in FIG. 1, at time T5 the utilization of the logical unit changes by more than 50% from the previous utilization. That is, the amount of data stored in the logical unit at time T5 is more than 150% of the amount of the data that was stored in the logical unit at time T4. As a result of this change threshold trigger condition, the logical unit is compressed, and at time T6, the logical unit again contains only compressed data, and is approximately 60% utilized.

Other conditions may trigger a compression or recompression. For example, at time T7, T8, and T9, the utilization of the logical unit increases until, at T9, another trigger condition is met: more than 80% utilization of the logical unit. As a result of this capacity threshold trigger condition, the logical unit is again compressed. At time T10, the logical unit again contains only compressed data, and is approximately 70% utilized.

When data that exists on the compressed logical unit is modified, the system determines whether the data to be modified exists on the logical unit as compressed or uncompressed data. If the data to be modified exists on the logical unit as compressed data, the system may uncompress the data, modify the uncompressed data, and write the modified data back to the logical unit. Instead of writing the data back to the logical unit in compressed form, the system writes the data back to the logical unit in uncompressed form.

In one embodiment, if an entire chunk of compressed data is overwritten, however, the compressed data is not decompressed; instead, the new data may be written to the logical unit, either overwriting compressed data currently stored within the chunk with new, uncompressed data, or alternatively, writing the uncompressed data to one or more new 8 KB mapping units, mapping the new 8 KB mapping units into the MLU logical address space, and deallocating the 8 KB mapping units that were formerly mapped to that same MLU logical address space so that the mapping units may be used to store something else. This avoids the need to perform a decompression and thus saves time and resources.

Time T11 and T12 illustrate how utilization may be reduced. A portion of the compressed data may be deleted from the logical unit. The location of the data to be deleted must be located within the compressed data area, and that portion of the compressed data must be decompressed, as shown at time T11, before the data to be discarded can be deleted, as shown by the reduced size of the uncompressed data at time T12. Again, because lazy compression is implemented, the undeleted portion of the uncompressed data is not recompressed, and at time T13, additional data is written to the logical unit.

Figure 2:
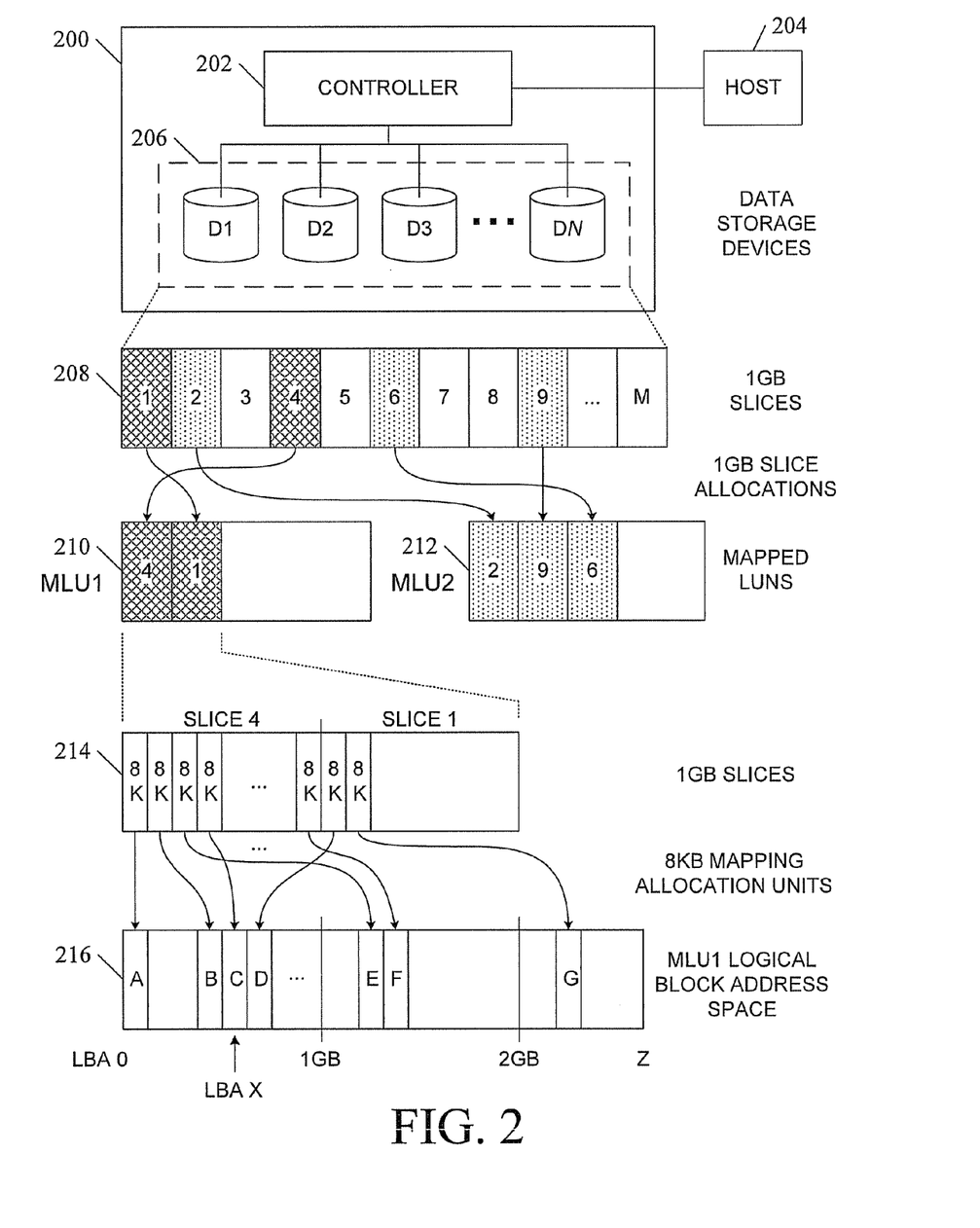
FIG. 2 is block diagram illustrating an exemplary system for lazy compression of data incoming to a data storage entity according to an embodiment of the subject matter described herein.

FIG. 2 is block diagram illustrating an exemplary system for lazy compression of data incoming to a data storage entity according to an embodiment of the subject matter described herein. Data storage system 200 includes a controller 202 for communicating with one or more hosts 204 to read and write data to one or more data storage devices 206, whose collective data storage capacity is represented as data storage area 208. In the embodiment illustrated in FIG. 2, data storage system 200 has N number of data storage devices, labeled D1 through DN. Data storage devices 206 may include hard disk drives, floppy disk drives, tape drives, FLASH drives, or any other form of persistent storage. In one embodiment, data storage devices 206 may be organized into redundant arrays of inexpensive disks (RAID) groups.

In one embodiment, the total data storage area 208 may be divided into slices for allocation to one or more logical units, or LUs. In the embodiment illustrated in FIG. 2, data storage area 208 is divided into M number of 1 gigabyte (1 GB) slices. In one embodiment, the pool of data storage devices 206 are first divided into RAID groups, which are themselves divided into several logical units each. 1 GB slices are provisioned from those logical units.

In one embodiment, data storage system 200 supports sparsely allocated logical units, also called thinly allocated logical units (TLUs), in which slices are allocated to the logical unit as needed, in contrast to fully allocated logical units, in which all of the slices that the logical unit will ever need based on its projected maximum size are allocated to the logical unit at the time of its creation. In the embodiment illustrated in FIG. 2, data storage system 200 supports mapped logical units, or MLUs, in which the slices that are allocated to the TLU are not necessarily contiguous within the collective data storage area. For example, mapped MLU1 210 has been allocated two slices from data storage area 208—namely, slice 4 and slice 1. MLU2 212 has been allocated three slices from data storage area 208—namely, slice 2, slice 9, and slice 6.

In one embodiment, each slice may be further subdivided into portions that are allocated and mapped to the MLU as needed. These portions of a slice are herein referred to as "mapping allocation units". In the embodiment illustrated in FIG. 2, mapping allocation units are 8 KB in size, but other sizes could also be used. In this scenario, slices are said to be provisioned to an MLU, and portions of the slice are said to be allocated to specific ranges of logical block addresses within the MLU. In the embodiment illustrated in FIG. 2, the data storage area represented by slices 4 and 1 are represented as container 214, which is a data structure that allows the MLU to be presented as a data storage area having a logical block address space larger than the physical space that is actually present. Container 214 maps the 8 KB mapping allocation units into the logical block address space of MLU1 210, which is represented as element 216 in FIG. 2. Note that the 8K mapping allocation units need not be mapped into contiguous logical block address spaces, and that the 8K mapping allocation units may be allocated from any 1 GB slice. For example, in the embodiment illustrated in FIG. 2, 8 KB mapping allocation units B, C, and D occupy contiguous portions of the logical block address space of MLU1 210, but do not occupy contiguous portions of slice 4 or slice 1. Moreover, mapping allocation units B and C are allocated from slice 4 while mapping allocation unit D is allocated from slice 1.

In one embodiment, logical block address space 216 is divided into compression domains, called "chunks". As stated above, the size of a chunk should be chosen as a compromise between compression efficiency (which increases with increasing chunk size) and system performance (which decreases with increasing chunk size.) In one embodiment, illustrated in FIG. 3, a chunk size of 64 KB is chosen.

Figure 3:
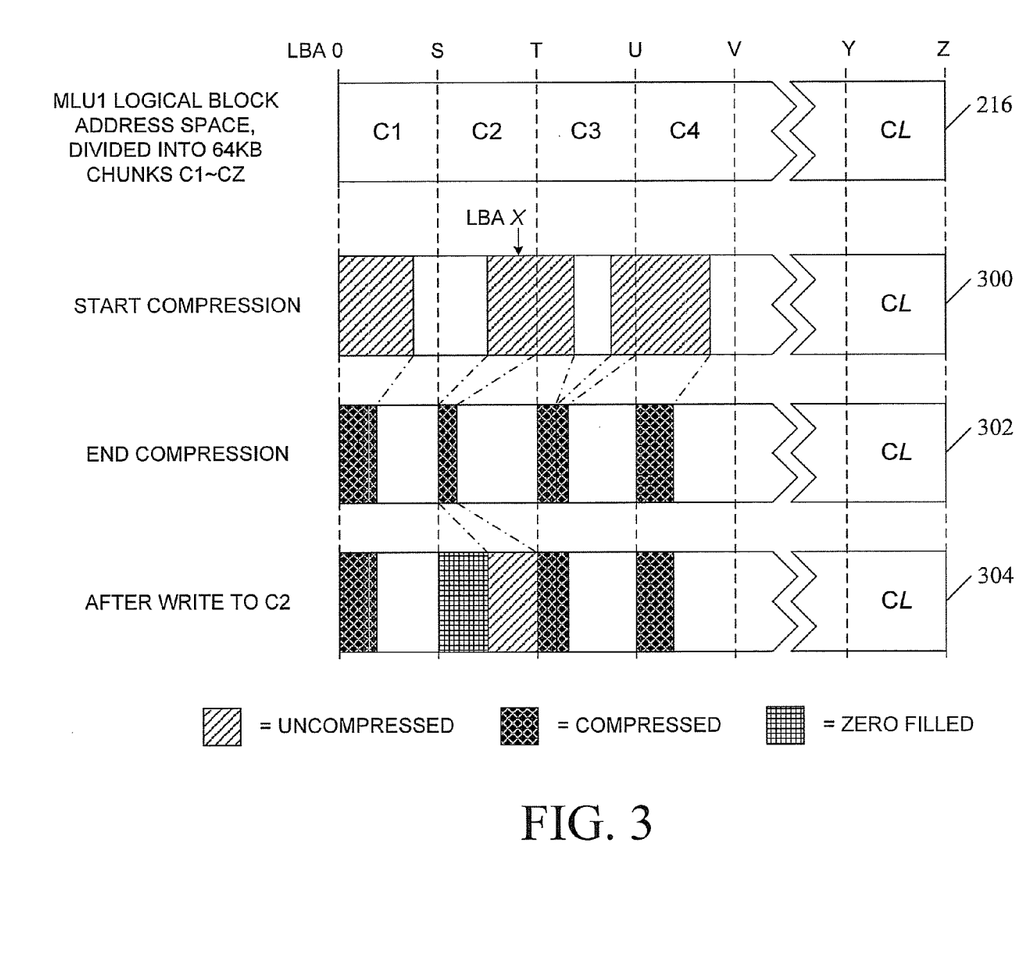
FIG. 3 illustrates an exemplary logical unit that has been divided into compression domains, called chunks, according to an embodiment of the subject matter described herein.

FIG. 3 illustrates an exemplary logical unit that has been divided into compression domains, called chunks, according to an embodiment of the subject matter described herein. In FIG. 3, the storage space of MLU1 210 is shown as presented to a user, i.e., as logical block address space 216, which has logical block addresses ranging from LBA 0 through LBA Z. Logical block address space 216 is divided into multiple 64 KB chunks, labeled C1 through CL. Logical block addresses S, T, U, V, and Y represent address boundaries between the 64 KB blocks. Each chunk C1 through CL is treated as an independent compression domain.

FIG. 3 illustrates three snapshots of the contents of a logical unit, such as MLU1 210, that implements lazy compression according to an embodiment of the subject matter described herein. Snapshot 300 shows the contents of MLU1 210 before compression. In this snapshot, each of chunks C1 through C4 contains uncompressed data. In this illustration, chunk CL contains no data.

Snapshot 302 shows the contents of MLU1 210 after compression, showing that each of chunks C1 through C4 has been compressed.

Snapshot 304 shows the contents of MLU1 210 after data has been written to the second chunk, C2. A write to a logical block address within C2 triggers data storage system 200 to determine whether that chunk is currently compressed or not. In the example illustrated in FIG. 3, chunk C2 has been compressed. The data within chunk C2 is then decompressed for reading or writing. In one embodiment, unused portions of a chunk may be zero-filled upon decompression. For example, in snapshot 300, only a portion of chunk C2 contained data prior to compression, but in snapshot 304, the formerly unused portion of chunk C2 has been zero filled.

If the chunk is to be read, the uncompressed data can be read from chunk C2. If the chunk is to be written, the write may proceed, e.g., by writing or modifying data within chunk C2. After either a read or a write, the system does not necessarily recompress the data within chunk C2. Instead, this recompression will occur only when and if needed, according to the principles of lazy compression described above with regard to FIG. 1.

Figure 4:
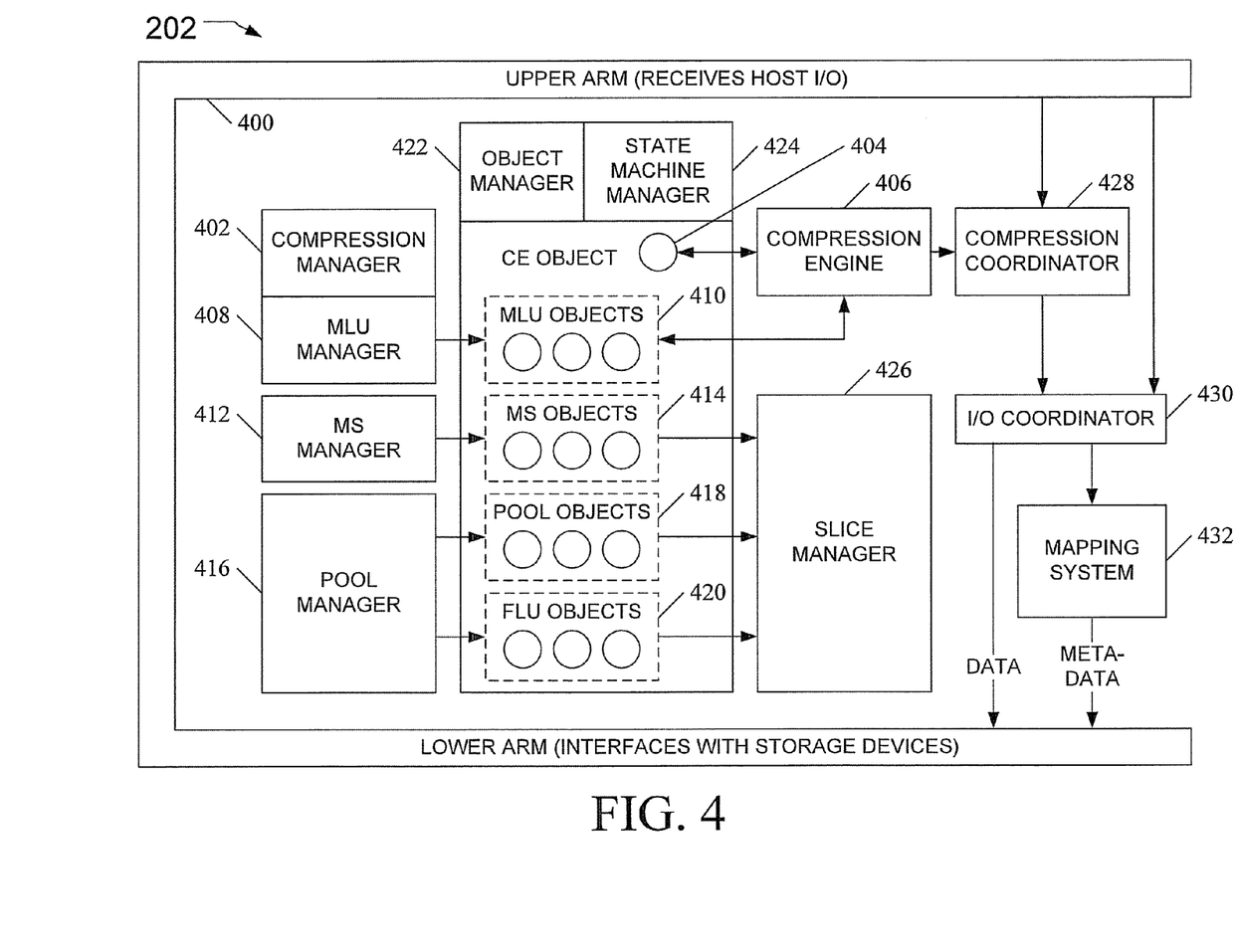
FIG. 4 is a block diagram illustrating a controller for implementing an exemplary system for lazy compression of data incoming to a data storage entity according to another embodiment of the subject matter described herein.

FIG. 4 is a block diagram illustrating a controller for implementing an exemplary system for lazy compression of data incoming to a data storage entity according to another embodiment of the subject matter described herein. In the embodiment illustrated in FIG. 4, controller 202 from FIG. 2 is shown in more detail. Controller 202 includes an interface 400 for receiving I/O requests from a host and for controlling the storage devices within the system. Because interface 400 is often in a shape that resembles a physical C-shaped clamp, interface 400 is colloquially referred to as "the C-clamp" having an "upper arm" that handles communication to and from the hosts and a "lower arm" that handles communication to and from the hard disk drives or other storage devices.

In the embodiment illustrated in FIG. 4, controller 202 includes a compression manager 402, which is a collection of interface routines to assist other components in interacting with data that is stored in various data constructs, called "objects", which are used by controller 202. Controller 202 also includes a compression engine (CE) object 404, which is an object representing the compression engine 406. CE object 404 is used to store global data relevant to compression, such as the global pause/resume and compression/decompression/recompression state. Compression engine 406 provides the background service that is used to compress, decompress, or recompress TLUs and MLUs.

Controller 202 includes a mapped logical unit (MLU) manager 408 for managing MLU objects 410, a mapping system (MS) manager 412 for managing MS objects 414, a pool manager 416 for managing pool objects 418 and RAID based logical unit objects (also known as "Flare" logical units, or FLUs) objects 420. An object manager 422 and state machine manager 424 are used to track and maintain the various objects (MLU, MS, pool, and FLU objects, for example) used by controller 202. A slice manager 426 is responsible for allocation of slices to logical units. In one embodiment, MLU manager 408 handles the control path and provides support for the logic in the I/O path by providing access to control path data.

A compression coordinator 428 processes host I/O requests that are received by the upper arm of C-clamp 400 and passed to compression coordinator 428, if compression is turned on, or to I/O coordinator 430, if compression is turned off. To service host I/O requests, compression coordinator 428, which is a component in the I/O path, will locate the appropriate chunk(s) and coordinate with compression engine 406 to decompress them if necessary.

I/O coordinator 430 waits for compression coordinator 428 to indicate that the uncompressed data is ready before processing the I/O request. I/O coordinator 430 sends write data to the lower arm of C-clamp 400 for eventual storage within data storage devices 206. I/O coordinator passes data to a mapping system 432. Mapping system 432 provides metadata to the lower arm of C-clamp 400.

In this manner, writes to a compressed chunk will result in the entire chunk being read, decompressed and rewritten, with the written data placed appropriately among the decompressed data. When the write is complete, compression coordinator 428 will deallocate the old compressed data. This avoids placing a compression step in the I/O path, but results in the LU becoming less compressed over time. To combat this, compression engine 406 will periodically re-compress the LU in response to a trigger condition.

In the embodiment illustrated in FIG. 4, compression coordinator 428 takes incoming I/O from both the C-clamp 400 upper arm and from compression engine 406, establishes the internal data layout, and manages all sub-I/O necessary to complete a given incoming I/O request. In one embodiment, compression coordinator 428 will arrange data in a specialized layout to ensure the availability of a logical block address range for both compressed and uncompressed data for any given chunk. In one embodiment, compression engine 406 is a throttled, pause-able background service that uses a compression library to compress or decompress the data. In one embodiment, at initialization, compression engine 406 may start a number of work threads for performing the compression, recompression, or decompression operations. When all work threads are active, subsequent compression operations will be queued within the compression engine 406.

In one embodiment, compression engine 406 will interact with compression coordinator 430 to compress or decompress a chunk. Compression coordinator 430 will complete the request and provide notification of the status, such as: successful, out of space, out of other resources like chunk buffers, or I/O error. If chunk compression fails, compression engine 406 may simply proceed to the next chunk. If chunk decompression fails, compression engine 406 may stop decompression and log an error.

In one embodiment, compression engine 426 may monitor compression engine object 406, which may indicate that a TLU is subject to an initial compression, a recompression, a decompression, etc. In one embodiment, initial compression applies to every chunk in the TLU. During a recompression, compression engine 426 may request a list of uncompressed extents from compression coordinator 430. In one embodiment, both initial compression and recompression will proceed in a forward fashion, updating a persistent status marker after a predetermined number of chunks have been processed. If a chunk behind the progress marker is decompressed to service a host write, then that chunk will remain decompressed until the next recompression pass.

During a compression, compression engine 426 may track the amount of space it has saved. In one embodiment, if compression engine 426 observes that it has recovered an entire slice worth of data, compression engine 426 may signal to MLU manager 412 that a slice evacuation is likely to be successful. Alternatively, compression engine 426 may notify MLU manager 412 any time the persistent progress marker is updated, and MLU manager 412 may determine whether evacuation is likely to succeed. Compression engine 426 may also signal for evacuation at the end of every compression pass in case the fractional savings are enough to free another slice. MLU manager 412 may coalesce evacuation requests and free as many slices as it discovers possible, which may be zero. Upon completing a compression pass, compression engine 426 may set the "last consumed capacity" in the corresponding MLU object 410.

In one embodiment, when work threads are idle, they may periodically scan for MLU objects 410 which have compression activated to see if any MLUs have increased utilization since the time of the MLU's last compression operation. If so, the thread may begin a recompression operation. For the purposes of checking if recompression is needed, compression engine 426 may use an interface of MS manager 412 to obtain the actual capacity consumed by mapping system 434. This provides an accurate picture of storage used that is not subject to the timing of the completion of slice evacuation requests.

In one embodiment, a user of data storage system 200 may set a value for compression and/or decompression rate, in order to control how fast the compression or decompression process operates or how many resources the process consumes.

Direct mapped logical units, especially those that are mapped to RAID arrays, such as Flare LUs (FLUs) cannot be compressed directly, because there is no way to release storage from the middle of a FLU and return it to that logical unit's RAID group. One approach is to overcome this limitation is to migrate the FLU to a thinly provisioned LU (TLU) and then compress it.

Figure 5:
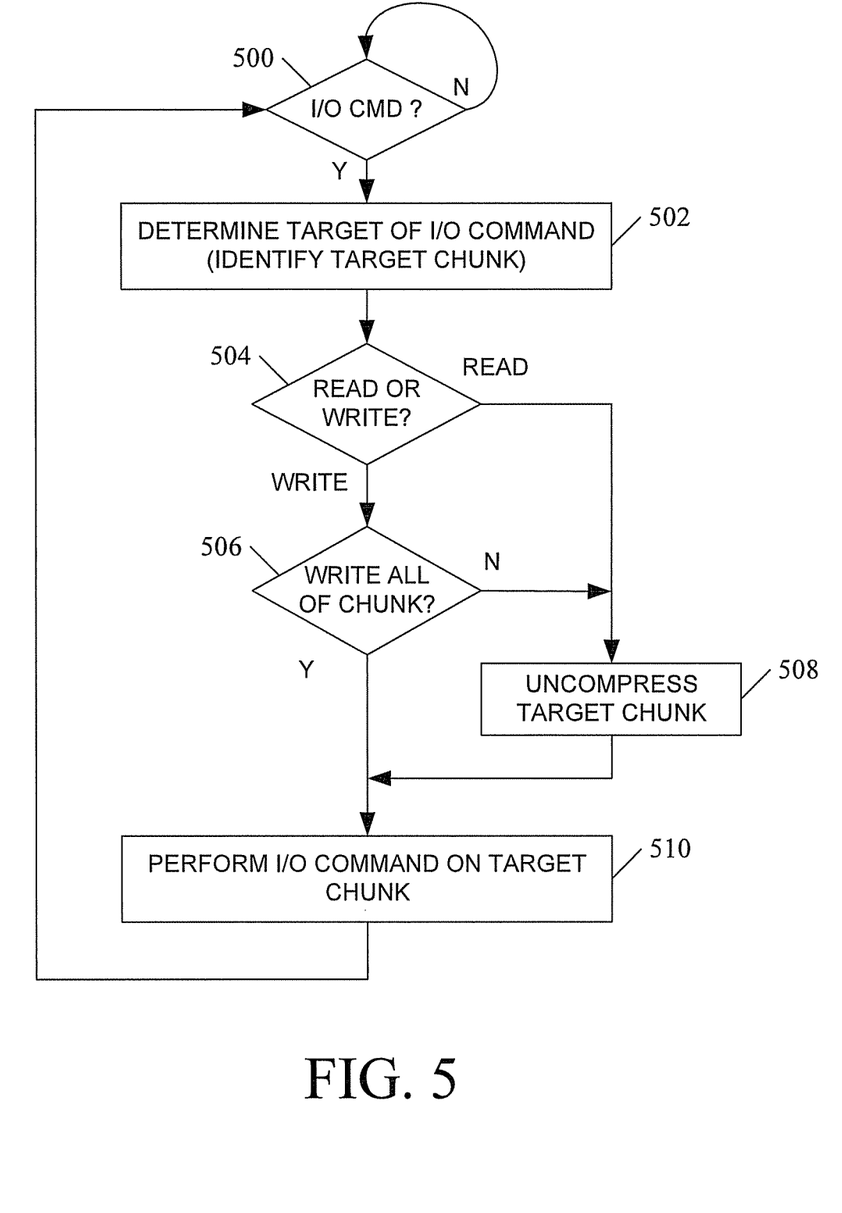
FIG. 5 is a flow chart illustrating an exemplary process for lazy compression of data incoming to a data storage entity according to an embodiment of the subject matter described herein.
Figure 6:
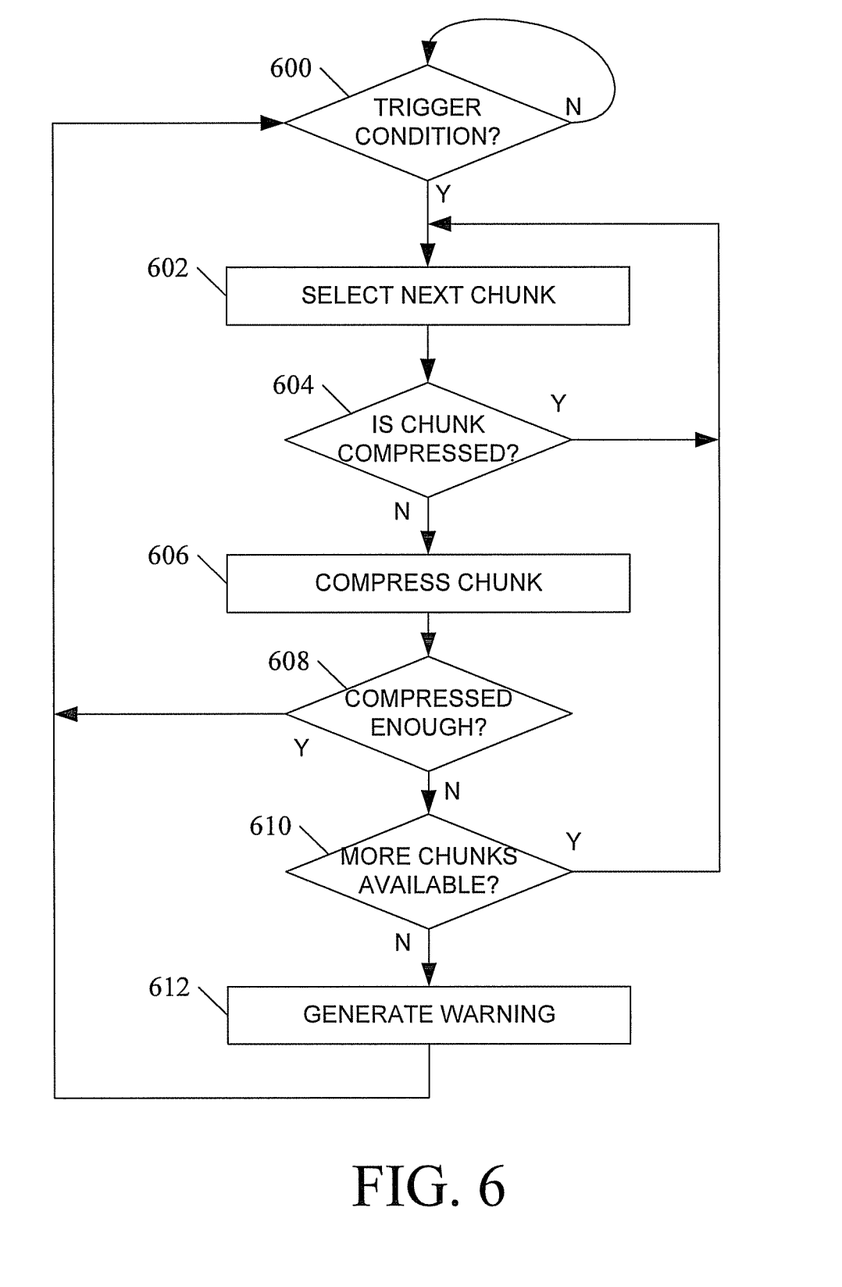
FIG. 6 is a flow chart illustrating another exemplary process for lazy compression of data incoming to a data storage entity according to an embodiment of the subject matter described herein.

FIGS. 5 and 6 are a flow charts illustrating exemplary processes for lazy compression of data incoming to a data storage entity according to another embodiment of the subject matter described herein. Each of these two processes will now be described in detail.

FIG. 5 is a flow chart illustrating a first portion of an exemplary process for lazy compression of data incoming to a data storage entity according to an embodiment of the subject matter described herein. FIG. 5 describes how an I/O command, and especially an I/O write to a compressed logical unit, is handled.

At block 500, a data storage system waits until an I/O command has been received. Example I/O commands include, but are not limited to, I/O read, in which data is read from the data storage entity, and I/O write, in which data is written to the data storage entity. For example, referring to FIG. 2, controller 202 may receive an I/O command from host 204. If an I/O command is received, the process flow moves to block 502.

At block 502, the target of the I/O command is identified. For I/O commands that are directed to a logical block, the location of the logical block must be identified. Each logical block is within a chunk, and thus the identity of the target chunk is determined. For example, host 204 may issue an I/O write to logical block address X (LBA X) of MLU1 210. As shown in FIG. 2, LBA X is located within 8 KB mapping allocation unit C, and as shown in FIG. 3, LBA X is located within chunk C2. For the purpose of illustration, it is presumed for this example that the logical unit is compressed, i.e., it is in the state shown in element 302 of FIG. 3.

At block 504, it is determined whether the I/O command is a read or a write. If the I/O command is a write, the process moves to block 506, where it is determined whether the write data will completely overwrite the contents of the target chunk, in which case it is unnecessary to first decompress the target chunk, and the process flow moves directly to block 510, where the I/O command is performed on the target chunk.

If, at block 504, it is determined that the I/O command is a read, or if, at block 506, it is determined that not all of the chunk will be overwritten by the write data, the process flow moves to block 508, where the target chunk is uncompressed in preparation for the read or partial write. Again using the example illustrated in FIG. 3, in response to an I/O command to LBA X, which is a portion of chunk C2, it is determined that a write to LBA X does not overwrite all of the data within C2. Chunk C2 data is therefore uncompressed (i.e., the logical unit goes from the state shown in element 302 of FIG. 3 to the state shown in element 304 of FIG. 3.) The process then moves to block 510 where the I/O command is performed on the target chunk.

FIG. 6 is a flow chart illustrating a second portion of an exemplary process for lazy compression of data incoming to a data storage entity according to an embodiment of the subject matter described herein. FIG. 6 describes an embodiment of the lazy compression process.

Referring to FIG. 6, at block 600, the process waits until a trigger condition has been met. Example trigger conditions include, but are not limited to, a change of utilization of a volume, logical unit, or chunk. Upon detection of a trigger condition, the process moves to block 602 in which the first of potentially many chunks may be compressed.

In one embodiment, a compression may be triggered if the amount of used data storage space increases (or the amount of free space decreases) by a threshold amount or a threshold percentage. For example, compress or recompression may be triggered by one or more of these conditions: if utilization reaches 10% or 10 GB, whichever comes first; if 5 GB of new data has been written to a 50 GB TLU since last compression;

if 10 GB of new data has been written to a 50 GB TLU since last compression; etc. Other potential conditions which may trigger a compression operation include a command to convert an uncompressed logical unit to a compressed logical unit, or even the detection of I/O inactivity for a threshold amount of time, e.g., a compression of data in preparation for moving the data contents to archival storage. Furthermore, multiple types of trigger conditions may be defined. For example, there may be a set of system-level trigger conditions that apply to all TLUs within system 200, and there may also be LU-specific triggers that apply only to a particular TLU or MLU.

At block 604, it is determined whether the selected chunk is compressed. If the selected chunk is compressed, the process flow returns to block 602 to select another chunk, until an uncompressed chunk is found. If, at block 604, the selected chunk is uncompressed, the process flow moves to block 606, in which the selected chunk is compressed, and then to block 608.

At block 608, it is determined whether the logical unit has been compressed enough. In one embodiment, once a compression or recompression is triggered, the compression operation continues until all chunks within the LU are compressed; in this embodiment, a logical unit is not compressed enough until all block have been compressed. In an alternative embodiment, a logical unit may be compressed until the utilization of the logical unit has been shrunk to below a target size. In this embodiment, a lazy compression may be very lazy—e.g., it will compress only enough to shrink the utilization of the logical unit to below a target compressed size and then stop the compression process. Such an approach may be useful in a system where resources are scarce or in high demand, in which case the compression should continue only as long as needed to guarantee a certain amount of free space. In the embodiment illustrated in FIG. 6, if, at block 608, it is determined that the logical unit has been compressed enough, the process flow returns to block 600, and the process again waits for a trigger condition. If, at block 608, it is determined that more compression is needed, the process moves to block 610, which determines if there are more chunks available. If so, the process returns to block 602, in which the next chunk is selected for consideration. If, at block 610, there are no more chunks available, the process may move to block 612, in which a warning is generated, e.g., to notify the user or administrator of the system that compression was not successful to the desired degree.

In one embodiment, the logical unit is compressed one chunk at a time. If the compression is triggered by a change of the logical unit from an uncompressed type to a compressed type, the chunks of the logical unit may be processed one by one until all of the chunks are compressed. Alternatively, chunks of the logical unit may be compressed until another trigger condition, a condition that stops compression, is detected. For example, chunks of a logical unit may be compressed until the utilization of the logical unit meets a utilization threshold, such as utilization below 60% (or alternatively, free space above 40%). Compression may also be stopped by a relative change threshold, such as detection that the logical unit has reduced its size by a certain percentage.

In the embodiment illustrated in FIG. 6, there may be continual monitoring for a trigger condition, but the subject matter described herein is not intended to be so limited. In one embodiment, the trigger condition may be checked for periodically or in response to another operation, such as receipt and processing of an I/O, change of status of an LU, or other conditions.

In one embodiment, the processes described in FIGS. 5 and 6 may be performed independently and in parallel. In another embodiment, the process described in FIG. 6 may be triggered by particular steps of the process described in FIG. 5.

The principles of lazy compression may likewise be applied to decompression, i.e., to implement a "lazy decompression" scheme. In systems that implement conventional decompression, when a logical unit has been changed from compressed type to decompressed type, all of the data on that logical unit is subject to decompression, e.g., starting immediately or starting when the opportunity arises and/or the needed resources become available. In such conventional systems, the intent is that all of the data on the logical unit or volume will be decompressed, either immediately or eventually.

In contrast, "lazy" decompression occurs when a logical unit has been changed from compressed type to uncompressed type, but unlike the conventional decompression described above, in one embodiment of lazy decompression the compressed data is uncompressed only in response to reading from or writing to a compressed portion of the logical unit. If a compressed portion of a logical unit is not read from or written to, that portion could theoretically remain compressed indefinitely.

In one embodiment, lazy decompression is an additional feature of a system that implements lazy compression. Since lazy compression decompresses data when and if needed, and provides a background process to compress or recompress data in response to some trigger, another way to describe lazy decompression is to say that lazy compression involves stopping or pausing the background compression process for the logical unit that is being lazily decompressed.

In another embodiment, lazy decompression may be applied to a logical unit which has been subject to conventional (i.e., non-lazy) compression. For example, a logical unit that has been subject to conventional compression may be fully compressed. If lazy decompression is then enabled for that compressed logical unit, portions of the logical unit may be uncompressed only when that portion is read from or written to, and not recompressed after the read or write operation has been completed. Although a volume or logical unit that is lazily decompressed may eventually contain no compressed portions as a result of the read and write operations that are applied to it, this is not guaranteed to occur. In contrast, for a volume that is subject to conventional decompression, it is intended that the conventionally decompressed volume be completely decompressed. In other words, it is virtually guaranteed that a conventionally decompressed volume be totally decompressed, barring any system failure or other fault that prevents the task of decompressing all of the logical unit from completing as intended.

Figure 7:
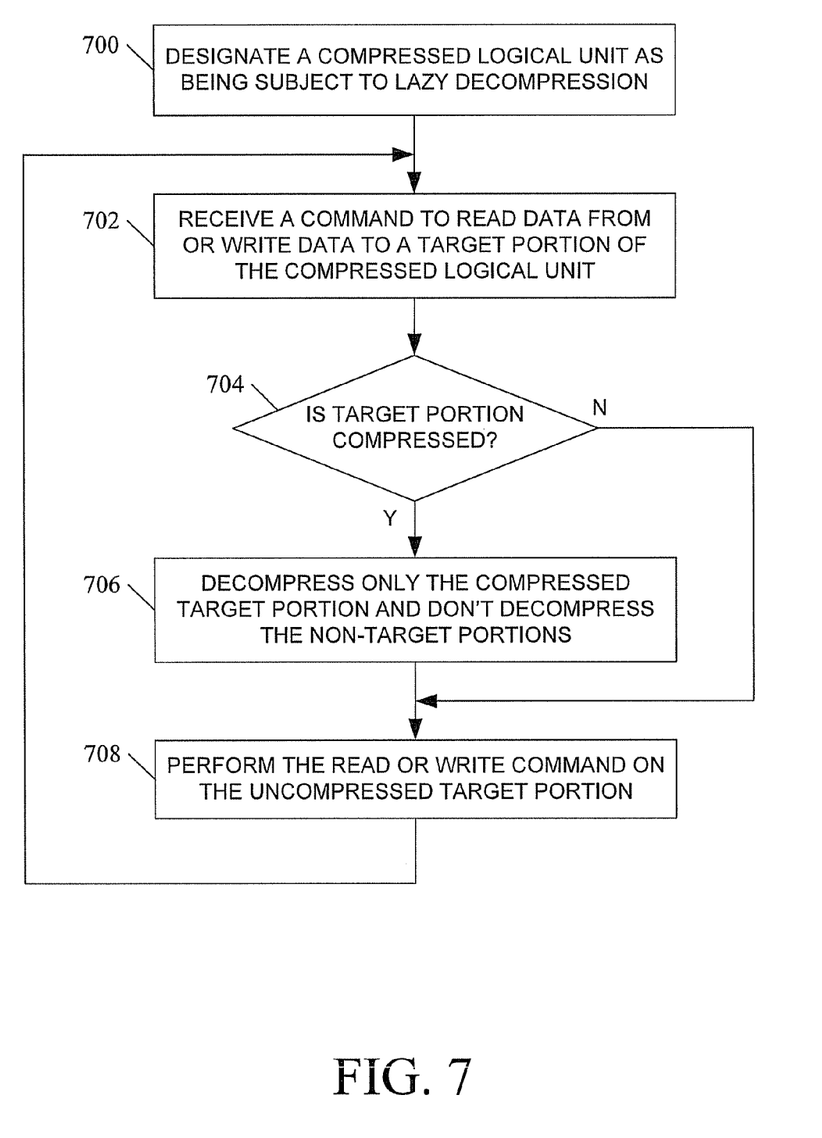
FIG. 7 is a flow chart illustrating an exemplary process for lazy decompression of a compressed portion of a data storage entity according to an embodiment of the subject matter described herein.

FIG. 7 is a flow chart illustrating an exemplary process for lazy decompression of a compressed portion of a data storage entity according to an embodiment of the subject matter described herein. In the flow chart illustrated in FIG. 7, the portion of the data storage entity that is compressed is a logical unit, but the subject matter described herein is not so limited, and contemplates lazy decompression of a portion of a logical unit, all or a portion of a volume, all or a portion of a RAID group, etc.

At block 700, a logical unit that was formerly designated as a compressed logical unit for storing compressed data is designated as being subject to lazy decompression. For example, the logical unit type may be changed from "compressed" or "lazily compressed", to "lazily decompressed" type. In one embodiment, if the logical unit was previously designated as being lazily compressed or subject to lazy compression, a background compression task would perform compression when and if needed. In this embodiment, changing the logical unit type to lazily decompressed or subject to lazy decompression would stop, halt, or suspend the background compression task for that logical unit.

At block 702, a command is received to read data from or write data to a target portion of the logical unit. At block 704, it is determined whether the target portion of the logical unit is compressed, and if so, the process moves to block 706 where the target portion is decompressed and non-target portions are not decompressed, and then to block 708 where the command is performed on the now-uncompressed target portion. If, at block 704, it is determined that the target portion is not compressed, the process goes directly to block 708. From block 708, the process returns to block 702 upon receipt of a new command, and the processes continues indefinitely until the logical unit type changes again. At no time are non-target compressed portions, i.e., compressed portions of the logical unit that are not the target of a read or write command, decompressed. In one embodiment, there is no background process for decompressing non-target portions (or, if the background process exists, the background process is stopped or paused indefinitely.)

It will be understood that various details of the subject matter described herein may be changed without departing from the scope of the subject matter described herein. Furthermore, the foregoing description is for the purpose of illustration only, and not for the purpose of limitation.

What is claimed is:

1. A method for lazy compression of data incoming to a data storage entity, the method comprising:

in a data storage entity having a plurality of data storage devices whose collective data storage capacity defines a non-volatile data storage area, defining at least a portion of the data storage area within the data storage entity as a compressed logical unit occupying a predefined logical block address space and divided into a plurality of chunks, wherein for each chunk, data may be stored in compressed form or stored in uncompressed form and later compressed and wherein each chunk comprises an independent compression domain;

at a controller for receiving input/output requests from hosts and for controlling the data storage devices:

receiving a command to write data to a logical block address within the compressed logical unit, and, in response to receiving the command to write data to logical block address within the compressed logical unit, identifying a target chunk within the compressed logical unit corresponding to the logical block address, determining whether data in the target chunk to be modified by the command exists on the logical unit as compressed or uncompressed data, and if the data to be modified exists on the logical unit as compressed data, determining whether the data to be written to the target chunk by the command will completely overwrite all of the data in the target chunk, and if the data to be written to the target chunk by the command will completely overwrite all of the data in the target chunk, writing the data to the target chunk without uncompressing the data in the target chunk and if the data to be written to the target chunk by the command will not completely overwrite the data in the target chunk uncompressing the data in the target chunk, modifying the uncompressed data, and writing the modified data to the target chunk of the compressed logical unit in uncompressed form; and monitoring for a trigger condition, and, upon detection of a trigger condition, compressing uncompressed data within the target chunk of the compressed logical unit.

2. The method of claim 1 wherein detection of a trigger condition comprises detection of at least one of:

writing a threshold volume of data to the compressed logical unit;

increasing a volume of data within the compressed logical unit by a threshold amount;

increasing the volume of data within the compressed logical unit to a threshold amount;

increasing a volume of data within the compressed logical unit by a threshold percentage;

increasing the volume of data within the compressed logical unit to a threshold percentage;

a command to compress uncompressed data within the compressed logical unit.

3. The method of claim 1 wherein each chunk comprises a portion of the compressed logical unit having a range of contiguous logical block addresses.

4. The method of claim 3 wherein each chunk is sixty-four kilobytes in size.

5. The method of claim 1 wherein defining the at least a portion of the data storage area within the data storage entity as a compressed logical unit comprises defining at least a portion of one of a hard disk drive, a floppy disk drive, a non-volatile memory, and a FLASH drive as a compressed logical unit.

6. The method of claim 1 wherein the monitoring for a trigger condition, and, upon detection of a trigger condition, compressing at least a portion of the uncompressed data within the compressed logical unit is performed independently of the receiving a command to write data to the compressed logical unit, and, in response to receiving the command to write data to the compressed logical unit, writing the data in uncompressed form.

7. The method of claim 1 wherein the compressing at least a portion of the uncompressed data within the compressed logical unit is performed at a specified rate.

8. A system for lazy compression of data incoming to a data storage entity, the system comprising:

a plurality of data storage devices having non-volatile data storage space for storing data, the collective data storage space being divided into a plurality of slices for allocation to at least one logical unit, wherein at least one logical unit is a compressed logical unit occupying a predefined logical block address space and divided into a plurality of chunks, wherein for each chunk, data may be stored in compressed form or stored in uncompressed form and later compressed and wherein each chunk comprises an independent compression domain; and a controller for receiving input/output requests from hosts and for controlling the data storage devices, the controller further including:

a first module for receiving a command to write data to a logical block address within the compressed logical unit, and, in response to receiving the command to write data to the logical block address within the compressed logical unit, identifying a target chunk within the compressed logical unit corresponding to the logical block address, determining whether data in the target chunk to be modified by the command exists on the logical unit as compressed or uncompressed data, and if the data to be modified exists on the logical unit as compressed data, determining whether the data to be written to the target chunk by the command will completely overwrite all of the data in the target chunk, and if the data to be written to the target chunk by the command will completely overwrite all of the data in the target chunk, writing the data to the target chunk without uncompressing the data in the target chunk and if the data to be written to the target chunk by the command will not completely overwrite the data in the target chunk, uncompressing the data, modifying the uncompressed data, and writing the data to the target chunk of the compressed logical unit in uncompressed form; and a second module for monitoring for a trigger condition, and, upon detection of a trigger condition, compressing uncompressed data within the target chunk of the compressed logical unit.

9. The system of claim 8 wherein the trigger condition comprises one of:
writing a threshold volume of data to the compressed logical unit;
increasing a volume of data within the compressed logical unit by a threshold amount;
increasing the volume of data within the compressed logical unit to a threshold amount;
increasing a volume of data within the compressed logical unit by a threshold percentage;
increasing the volume of data within the compressed logical unit to a threshold percentage; and
a command to compress uncompressed data within the compressed logical unit.

10. The system of claim 8 wherein each chunk comprises a range of logical block addresses within the compressed logical unit.

11. The system of claim 8 wherein each chunk is sixty-four kilobytes in size.

12. The system of claim 8 wherein at least one of the plurality of data storage devices comprises at least one of a hard disk drive, a floppy disk drive, a non-volatile memory, and a FLASH drive.

13. The system of claim 8 wherein at least some of the plurality of data storage devices are organized into redundant arrays of inexpensive disk (RAID) groups.

14. The system of claim 8 wherein at least some of the plurality of slices for allocation to at least one logical unit are organized into one of a sparsely allocated logical unit, a thinly allocated logical unit (TLU), and a mapped logical unit (MLU).

15. The system of claim 8 wherein the plurality of slices is further subdivided into mapping allocation units for allocation to the logical units.

16. The system of claim 15 wherein the mapping allocation units are mapped into the logical block address space of the logical unit to which the mapping allocation units are allocated.

17. The system of claim 15 wherein the mapping allocation units are eight kilobytes in size.

18. The system of claim 8 wherein the second module comprises a compression engine for compressing, decompressing, and recompressing logical units.

19. The system of claim 8 wherein the second module operates independently of the first module.

20. The system of claim 8 wherein the second module is triggered by an operation of the first module.

21. The system of claim 8 wherein the second module is configured to compress the uncompressed data within the logical unit at a specified rate.

22. A non-transitory computer readable medium having stored thereon executable instructions that when executed by the processor of a computer control the computer to perform steps comprising:
in a data storage entity having a plurality of data storage devices whose collective data storage capacity defines a non-volatile data storage area, defining at least a portion of the data storage area within the data storage entity as a compressed logical unit occupying a predefined logical block address space and divided into a plurality of chunks, wherein for each chunk, data may be stored in compressed form or stored in uncompressed form and later compressed and wherein each chunk comprises an independent compression domain;
at a controller for receiving input/output requests from hosts and for controlling the data storage devices:
receiving a command to write data to a logical block address within the compressed logical unit, and, in response to receiving the command to write data to logical block address within the compressed logical unit, identifying a target chunk within the compressed logical unit corresponding to the logical block address, determining whether data in the target chunk to be modified by the command exists on the logical unit as compressed or uncompressed data, and if the data to be modified exists on the logical unit as compressed data, determining whether the data to be written to the target chunk by the command will completely overwrite all of the data in the target chunk, and if the data to be written to the target chunk by the command will completely overwrite all of the data in the target chunk, writing the data to the target chunk without uncompressing the data in the target chunk and if the data to be written to the target chunk by the command will not completely overwrite the data in the target chunk, uncompressing the data in the target chunk, modifying the uncompressed data, and writing the modified data to the target chunk of the compressed logical unit in uncompressed form; and
monitoring for a trigger condition, and, upon detection of a trigger condition, compressing uncompressed data within the target chunk of the compressed logical unit.

* * * * *